United States Patent
Wilson et al.

(10) Patent No.: US 10,637,469 B2
(45) Date of Patent: Apr. 28, 2020

(54) SOLENOID FAST SHUT-OFF CIRCUIT NETWORK

(71) Applicant: Hamilton Sundstrand Corporation, Charlotte, NC (US)

(72) Inventors: Michael A. Wilson, Scottsdale, AZ (US); Eduardo Ahuactzin Parra, Phoenix, AZ (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 15/654,430

(22) Filed: Jul. 19, 2017

(65) Prior Publication Data
US 2019/0028099 A1  Jan. 24, 2019

(51) Int. Cl.
*H03K 17/732* (2006.01)
*H01F 7/18* (2006.01)
*H03K 17/0814* (2006.01)
*H03K 17/0416* (2006.01)
*H01H 47/32* (2006.01)
(Continued)

(52) U.S. Cl.
CPC ......... *H03K 17/732* (2013.01); *H01F 7/1811* (2013.01); *H01H 47/32* (2013.01); *H02H 9/047* (2013.01); *H03K 17/04163* (2013.01); *H03K 17/0822* (2013.01); *H03K 17/08142* (2013.01); *H03K 17/162* (2013.01); *H03K 17/731* (2013.01); *H01F 2007/1888* (2013.01); *H02M 7/527* (2013.01); *H03K 17/74* (2013.01); *H03K 2017/515* (2013.01)

(58) Field of Classification Search
CPC .............................. H03K 17/732; H03K 17/74
See application file for complete search history.

(56) References Cited

U.S. PATENT DOCUMENTS 4,455,585 A * 6/1984 Murari .................. H02H 7/067
  322/28
4,511,945 A   4/1985 Nielsen
(Continued)

FOREIGN PATENT DOCUMENTS

DE    102007029271 A1   12/2008
EP        1675245 A2    6/2006
(Continued)

OTHER PUBLICATIONS

Translation of FR 2,494,056 from the website http://translationportal.epo.org/emtp/translate/?ACTION=description-retrieval&COUNTRY=FR&ENGINE=google&FORMAT=docdb&KIND=A1&LOCALE=en_EP&NUMBER=2494056&OPS=ops.epo.org/3.2&SRCLANG=fr&TRGLANG=en accessed Feb. 1, 2019 (Year: 1982).*

(Continued)

*Primary Examiner* — Thomas J. Hiltunen
(74) *Attorney, Agent, or Firm* — Cantor Colburn LLP

(57) ABSTRACT

A fast shut-off solenoid circuit network includes a solenoid circuit and a current dissipation circuit. The solenoid circuit is operable in response to an electrical current, and configured to operate in an enable mode and a disable mode. The current dissipation circuit is configured to dissipate the current discharged from the solenoid circuit in response to invoking the disable mode. The fast shut-off solenoid circuit network further includes a dissipation bypass circuit. The dissipation bypass circuit is configured to divert the current discharged by the solenoid circuit away from current dissipation circuit when operating in the enable mode.

16 Claims, 4 Drawing Sheets

(51) Int. Cl.
*H02H 9/04* (2006.01)
*H03K 17/082* (2006.01)
*H03K 17/16* (2006.01)
*H03K 17/73* (2006.01)
*H03K 17/51* (2006.01)
*H02M 7/527* (2006.01)
*H03K 17/74* (2006.01)

(56) References Cited

U.S. PATENT DOCUMENTS

| | | | | |
|---|---|---|---|---|
| 4,536,818 | A | 8/1985 | Nielsen | |
| 6,917,234 | B2* | 7/2005 | Horn | H03K 17/0822 327/309 |
| 7,548,097 | B2* | 6/2009 | Dake | H03K 17/04206 323/289 |
| 8,593,830 | B2* | 11/2013 | Huynh | H02M 3/33546 363/21.01 |
| 2003/0039128 | A1* | 2/2003 | Cohen | H02M 3/158 363/20 |
| 2003/0165038 | A1 | 9/2003 | Ahrendt | |
| 2006/0077000 | A1* | 4/2006 | Goudo | H03K 17/08122 327/434 |
| 2006/0171527 | A1* | 8/2006 | Mills | H04M 3/005 379/395.01 |
| 2009/0268489 | A1* | 10/2009 | Lin | H02M 1/34 363/50 |
| 2011/0018512 | A1* | 1/2011 | Horii | H02M 3/158 323/282 |
| 2012/0188675 | A1* | 7/2012 | Oppermann | H01F 7/1811 361/91.6 |
| 2015/0098163 | A1* | 4/2015 | Ferrara | H02H 5/04 361/113 |
| 2016/0262227 | A1* | 9/2016 | Mednik | H05B 33/0815 |
| 2018/0091039 | A1* | 3/2018 | Bastholm | H02M 1/34 |
| 2018/0375325 | A1* | 12/2018 | Lofthouse | H02H 9/047 |

FOREIGN PATENT DOCUMENTS

| | | |
|---|---|---|
| FR | 2494056 A1 | 5/1982 |
| GB | 1144422 A | 3/1969 |

OTHER PUBLICATIONS

Definition of "bypass", www.dictionary.com/browse/bypass, accesssed Apr. 18, 2019.*
Definition of "shunt", www.dictionary.com/browse/shunt, accessed Apr. 18, 2019.*
Ammeter Design, www.allaboutcircuits.com/textbook/direct-current/chpt-8/ammeter-design, accessed Apr. 18, 2019.*
Search Report for European Application No. 18184307.9; Application Filing Date Jul. 18, 2018; dated Nov. 19, 2018 (8 pages).

* cited by examiner

SOLENOID FAST SHUT-OFF CIRCUIT NETWORK

BACKGROUND

Various non-limiting embodiments relate generally to aircraft vehicles, and more particularly, to aircraft control systems.

Aircraft vehicles flight control systems typically include various electromechanical switches to selectively enable or disable one or more flight control components. A conventional flight control circuit is illustrated in FIG. 1. The flight control circuit 100 includes an electromechanical switch that is operable in an enabled operating state or a disabled operating state. The electromechanical switch can be constructed as a solenoid including a solenoid load 102. The operating state can be selectively invoked in response to varying an electrical drive current flowing through the solenoid load 102. A voltage source 104 is continuously switched on and off using a pulse-width modulation (PWM) circuit 106 to generate the current that drives the solenoid switch.

Traditional flight control circuits 100 implement a solenoid discharge circuit 105 that includes a Zener diode 108 and a free-wheeling diode 109, which work together to protect one or more flight control system components such as a low side switch 111 connected to the solenoid load 102, for example, when invoking the disabled state by quickly dissipating the stored drive current. However, the Zener diode 108 also realizes a brief solenoid off-state caused by the switching operation of the PWM circuit 106. Therefore, the Zener diode 108 not only dissipates the drive current when invoking the disabled operating state but also dissipates an amount of current while the solenoid load 102 is enabled.

BRIEF DESCRIPTION

Disclosed is a fast shut-off solenoid circuit network includes a solenoid circuit and a current dissipation circuit. The solenoid circuit is operable in response to an electrical current, and configured to operate in an enable mode and a disable mode. The current dissipation circuit is configured to dissipate the current discharged from the solenoid circuit in response to invoking the disable mode. The fast shut-off solenoid circuit network further includes a dissipation bypass circuit. The dissipation bypass circuit is configured to divert the current discharged by the solenoid circuit away from current dissipation circuit when operating in the enable mode Also disclosed is a method of dissipating energy stored in a solenoid circuit, comprises delivering electrical current to a solenoid circuit that is configured to operate in an enable mode and a disable mode. The method further comprises dissipating the current discharged from the solenoid circuit, via a current dissipation circuit, in response to invoking the disable mode. The method further comprises diverting the current discharged from the solenoid circuit away from the current dissipation circuit, via a dissipation bypass circuit, when operating in the enable mode.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application. For example, "about" can include a range of ±8% or 5%, or 2% of a given value.

Various non-limiting embodiments described herein provide a fast shut-off solenoid circuit network that selectively discharges the drive current stored in the solenoid switch based on different current paths. When the disable mode is invoked, the stored drive current flows along a first current path to a dissipation circuit where it is quickly dissipated through a Zener diode without damaging the solenoid. Accordingly, the shut-off time of the solenoid can meet aggressive time constraints. For example, the fast shut-off solenoid circuit network described herein is capable of reducing the nominal solenoid shut-off time from about 4.0 milliseconds (ms) to about 0.3 ms. Unlike conventional solenoid circuits, however, the fast shut-off solenoid circuit network includes a dissipation bypass circuit. When the solenoid is enabled, current from the solenoid flows through the bypass circuit and bypasses the dissipation circuit. In this manner, power efficiency of the solenoid circuit network is significantly improved. In addition, thermal heat dissipation from the Zener diode is reduced because current bypasses the Zener diode while the solenoid switch is enabled.

Figure 1:
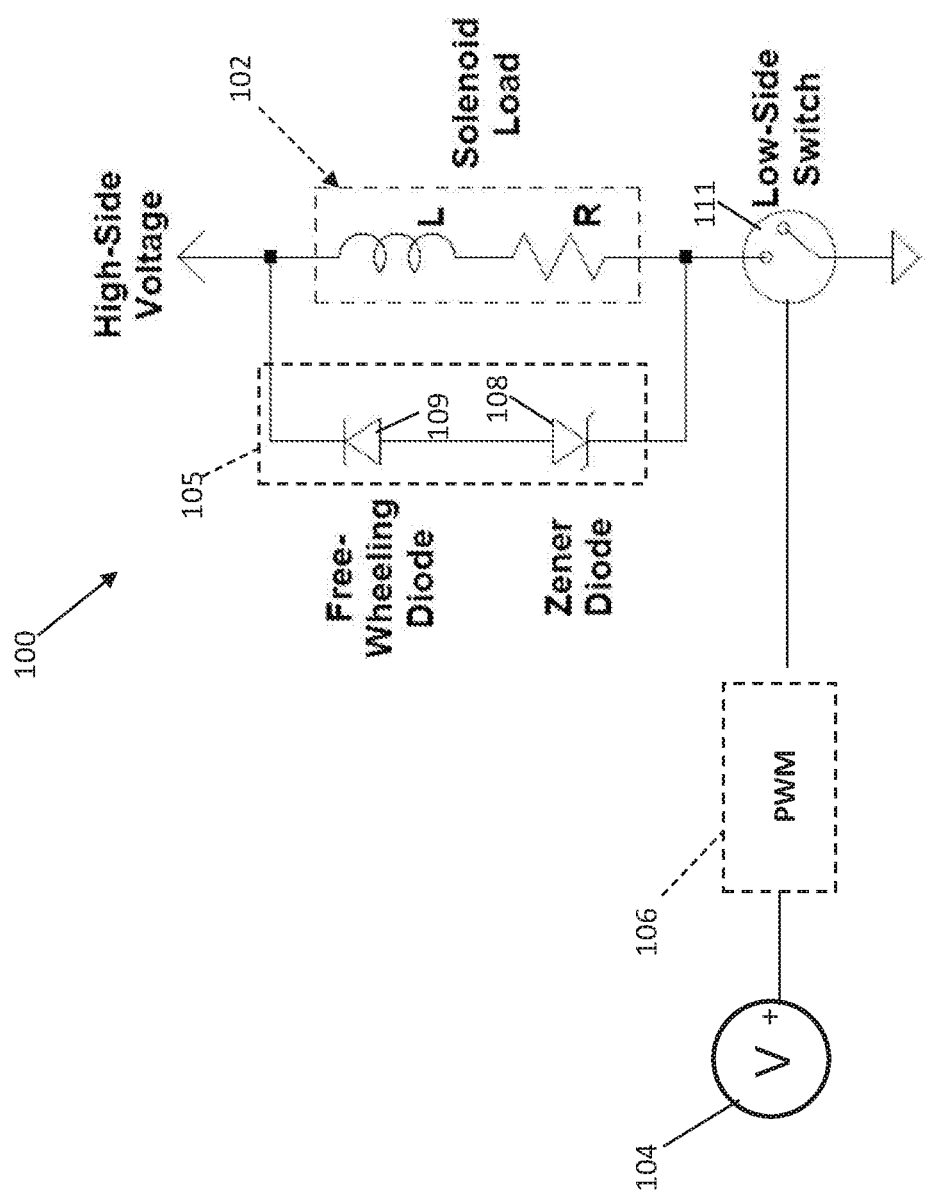
FIG. 1 is a schematic diagram of a flight control circuit including a conventional solenoid discharge circuit.
Figure 2:
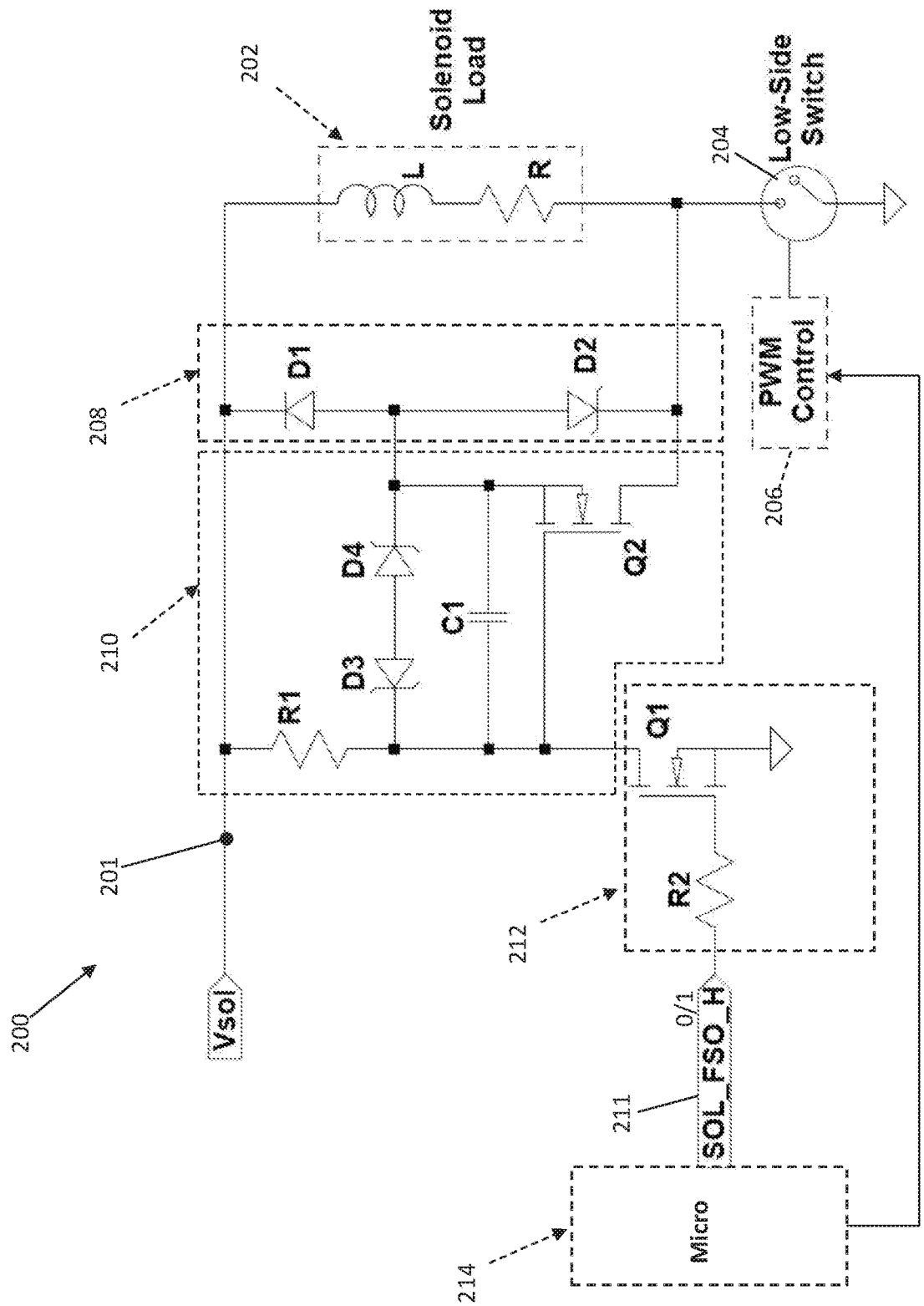
FIG. 2 is a schematic diagram of a fast shut-off solenoid circuit network according to a non-limiting embodiment.

With reference now to FIG. 2, a fast shut-off solenoid circuit network 200 is illustrated according to a non-limiting embodiment. The fast shut-off solenoid circuit network 200 includes a solenoid circuit 202, a low-side switch 204, a PWM circuit 206, a current dissipation circuit 208, a dissipation bypass circuit 210, a current path control circuit 212, and a controller 214.

The solenoid circuit 202 is configured to drive one or more actuators. The actuators can be implemented in a vehicle control system such as, for example, and a hydraulic control system installed on an aircraft. The solenoid circuit 202 is operable in an enable mode which conducts a drive current to the actuators and a disabled mode which serves to quickly disconnect the actuators from the hydraulic system. The solenoid circuit 202 includes a solenoid load defined by a series resistor-inductor (RL) circuit. The series RL circuit includes a load inductor (L) having an input terminal connected to a high-side voltage rail 201 which provides a voltage source (Vsol). The opposing terminal of the load inductor (L) is connected in series to a first end of a load resistor (R). The opposing end of the load resistor (R) is connected to the low-side switch 204, which selectively provides a ground reference point for the drive current.

The low-side switch 204 is continuously switched between an on-state and an off-state according to a duty signal of the pulsed output signal generated by the PWM circuit 206. The switching frequency of the low-side switch 204 regulates the drive current through the solenoid circuit 202. For instance, drive current through the solenoid circuit 202 is promoted when the low-side switch 204 is switched on, i.e., closed, while drive current through the solenoid circuit 202 is inhibited when the low-side switch 204 is switched off, i.e., open. Accordingly, the PWM circuit 206 can be controlled to vary the duty cycle of the pulsed output signal thereby regulating the drive current through the solenoid circuit 202.

The current dissipation circuit 208 is configured to quickly discharge the drive current from the solenoid circuit 202 in response to invoking the disabled mode. The current dissipation circuit 208 includes a free-wheeling diode (D1) and a Zener diode (D2). The free-wheeling diode (D1) includes a cathode connected to the high-side voltage rail 201 and an anode connected to an anode of the Zener diode (D2). The cathode of the Zener diode (D2) is commonly connected to the second end of the load resistor (R) and the low-side switch 204. When the solenoid circuit 202 operates in the enable mode, the free-wheeling diode (D1) serves to conduct the drive current from the solenoid load (i.e., the series RL circuit) during the off-state of the low-side switch 204. When, however, the disabled mode of the solenoid circuit 202 is invoked, the Zener diode (D2) serves to quickly dissipate the drive current that is discharged from the solenoid circuit 202. Accordingly, components in the fast shut-off solenoid circuit network 200 such as the low-side switch 204, for example, can be protected from damage while still quickly disconnecting the actuator(s) from the hydraulic circuit.

The dissipation bypass circuit 210 is configured to bypass discharged drive current away from the Zener diode (D2) while the solenoid circuit 202 is enabled. The dissipation bypass circuit 210 includes a bypass current path switch (Q2), a capacitor (C1), first and second switch protection diodes (D3) and (D4), and a timing resistor (R1).

The bypass current path switch (Q2) can be constructed as a semiconductor switch such as, for example, an N-channel metal oxide field effect transistor (MOSFET) which includes a drain terminal, a gate terminal, and a source terminal. Although a MOSFET is described, other types of transistor switches can be implemented without departing from the scope of the invention.

The drain terminal is commonly connected to the cathode of the Zener diode (D2), the opposing end of the load resistor (R), and the low-side switch 204. The gate terminal is commonly connected to the current path control circuit 212, and a first end of the capacitor (C1). The source terminal is connected to the opposite second end of the capacitor (C1) such that the capacitor (C1) is connected in parallel with the bypass current path switch (Q2).

A first end of the timing resistor (R1) is connected to the second end of the capacitor (C1) while the second end is connected to the high-side voltage rail 201. The resistance value of the timing resistor (R1) sets the charge time and discharge time of the capacitor (C1). Accordingly, a value of the timing resistor (R1) can be selected such that the capacitor (C1) maintains the gate-source voltage of the bypass current path switch (Q2) during the off-state of the low-side switch 204 when the solenoid circuit 202 is enabled.

The source terminal of the bypass current path switch (Q2) is also commonly connected to the anode of the free-wheeling diode (D1) and the cathode of the second switch protection diode (D4). The anode of the second switch protection diode (D4) is connected to the anode of the first switch protection diode (D3), while the cathode of the first switch protection diode (D3) is commonly connected to the capacitor (C1) and the current path control circuit 212. Accordingly, the combination of the first and second switch protection diodes (D3) and (D4) provides gate-source voltage protection for the bypass current path switch (Q2).

The controller 214 and the current path control circuit 212 work in conjunction to selectively invoke the enable mode and the disabled mode of the solenoid circuit 202. The controller 214 is programmed with various logic circuitry and thresholds parameters capable of diagnosing a system (e.g., hydraulic system) driven by the solenoid circuit 202. When the system is operating normally, the controller 214 outputs a low-value (e.g., 0, or e.g., 0 volts) solenoid control signal 211. When, however, the controller 214 detects a fault in the system, the controller 214 outputs a high-value (e.g., 1) solenoid control signal 211.

The controller 214 is also in signal communication with the PWM circuit 206. When the enable mode is selected, the controller 214 can power the PWM circuit 206, which generates the pulsed output signal that drives the low-side switch 204 between its on-state and its off-state. The controller 214 can also actively select the duty cycle of the pulsed output signal when the solenoid circuit 202 is enabled. When the disabled mode is selected, the controller 214 can disconnect the PWM circuit 206, which in turn maintains the low-side switch 204 in its off-state thereby disconnecting the solenoid circuit 204 from the ground reference point.

The current path control circuit 212 includes a fast shut-off switch (Q1), and a gate resistor (R2). The fast shut-off switch (Q1) can be constructed as a semiconductor switch such as, for example, an N-channel MOSFET. Although a MOSFET is described, other types of transistor switches can be implemented without departing from the scope of the invention.

A first end of the gate resistor (R2) is connected to the output of the controller 214 while the opposing end of the gate resistor (R2) is connected to the gate terminal of the fast shut-off switch (Q1). The source terminal of the fast shut-off switch (Q1) is connected to a ground reference point, while the drain terminal is connected to the gate terminal of the bypass current path switch (Q2). Accordingly, the fast shut-off switch (Q1) is configured to discharge the gate-source voltage of the bypass current path switch (Q2) in response to invoking the disabled mode, i.e., when the controller 214 outputs a high-value (e.g., 1 or e.g., 5 volts) solenoid control signal 211.

Figure 3:
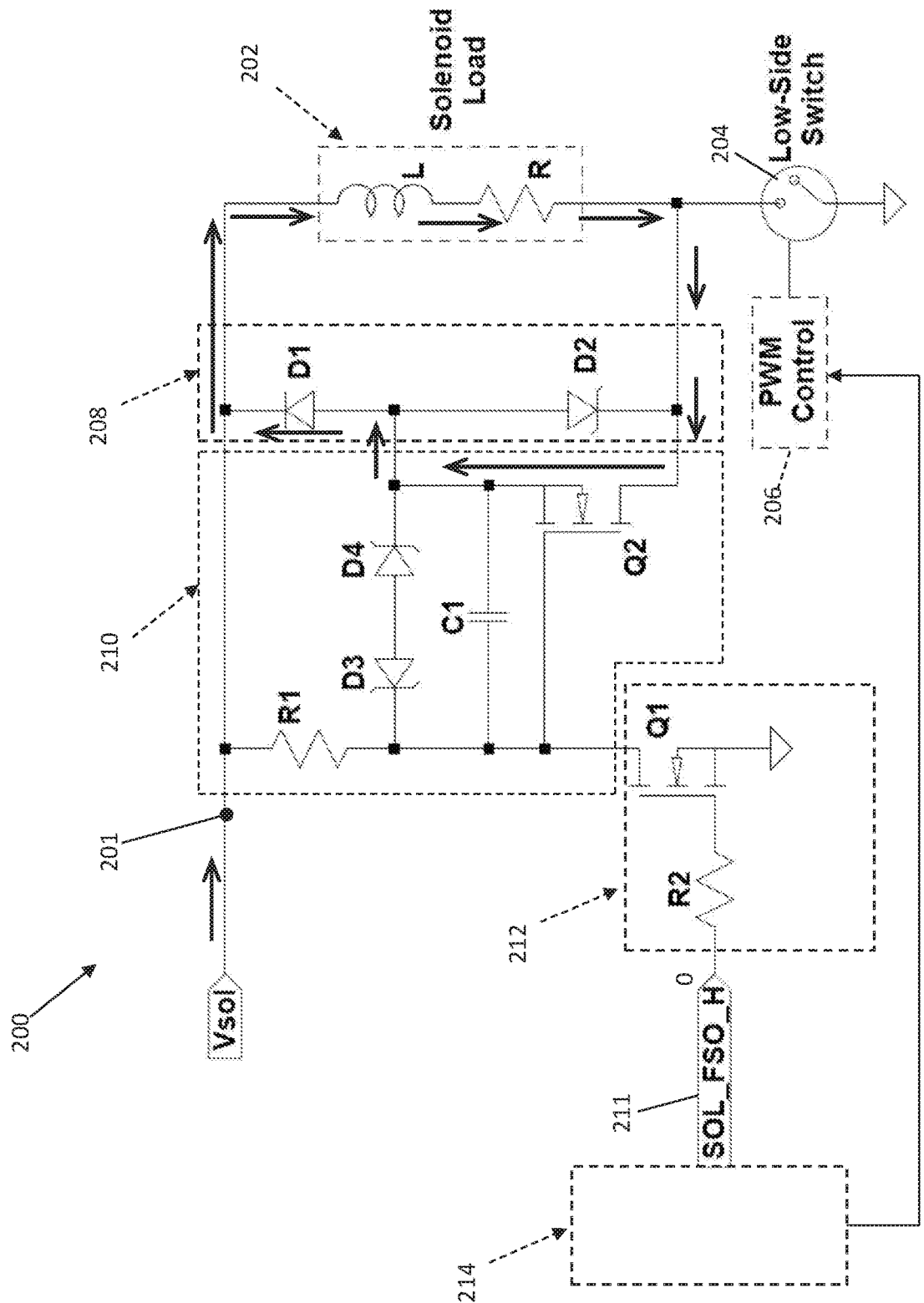
FIG. 3 is a schematic diagram of the fast shut-off solenoid circuit network illustrating the flow of current discharged from the solenoid circuit during an solenoid enabled mode.
Figure 4:
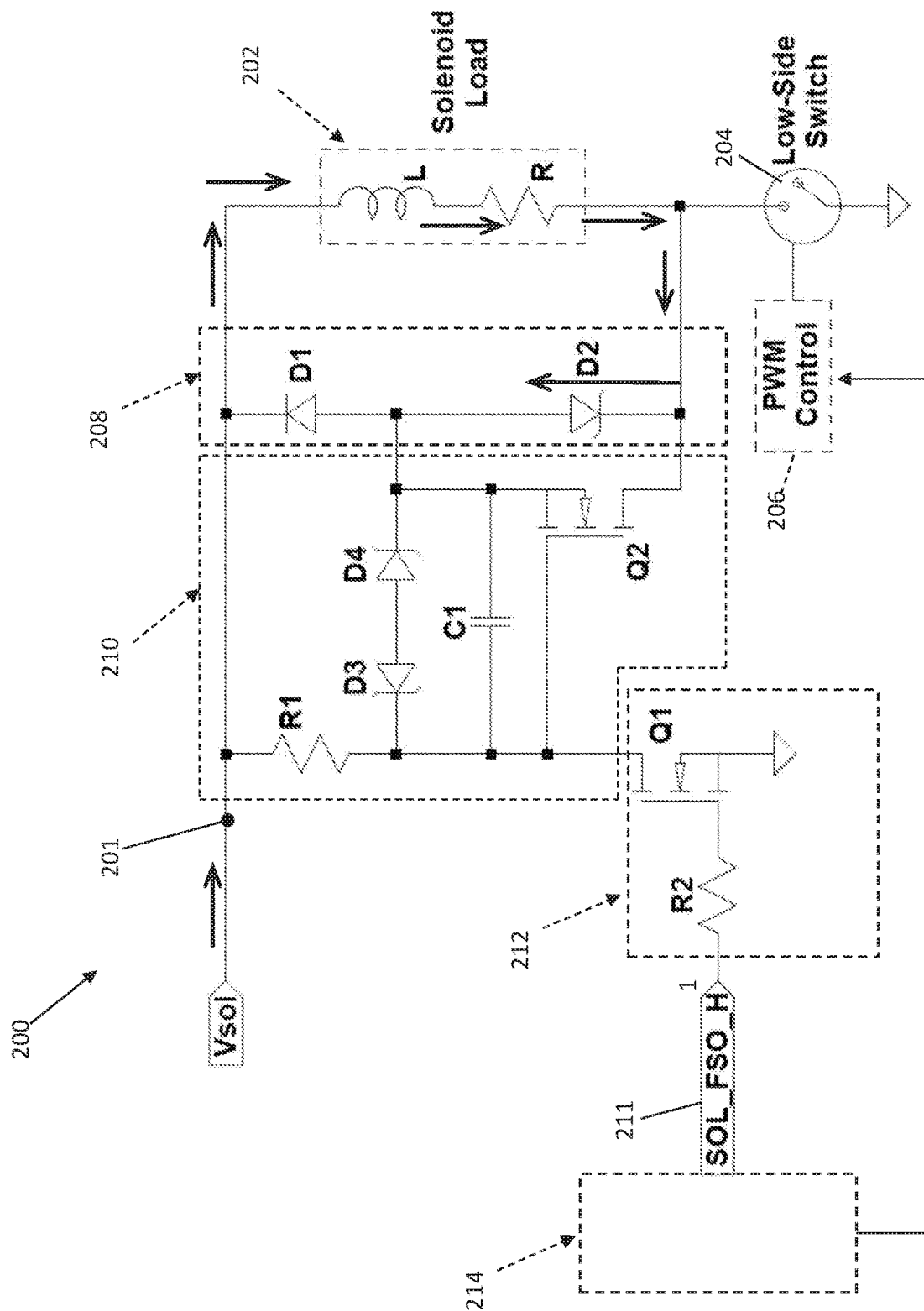
FIG. 4 is a schematic diagram of the fast shut-off solenoid circuit network illustrating the flow of current discharged from the solenoid circuit during a solenoid disabled mode.

Turning to FIGS. 3 and 4, operation of the fast shut-off solenoid circuit network 200 is illustrated according to non-limiting embodiments. When the controller 214 determines the system is operating normally, the controller 214 outputs a low-value (e.g., 0) solenoid control signal 211 which, in conjunction with activation of the PWM control circuit 206, invokes the enable mode of the solenoid circuit 202. The voltage at the drain of Q1 floats at a value that depends on the voltage across C1 Accordingly, the capacitor (C1) is charged based on the timing resistor (R1) to a voltage proportional to voltage level (Vsol) applied to the high-side rail 201, multiplied by the duty cycle of the low-side switch 204 (i.e., the duty cycle of the PWM signal). Once the voltage across the capacitor (C1) exceeds the gate-source threshold voltage of the bypass current path switch (Q2), the bypass current path switch (Q2) turns on and conducts the solenoid current (indicated by directional arrows) during the off-state of the low-side switch 204 (see FIG. 3).

When, however, the controller 214 determines a need to shut-off the solenoid circuit 202 (e.g., detects a fault in the system), the controller 214 outputs a high-value (e.g., 1) solenoid control signal 211 which invokes the disabled mode of the solenoid circuit 202. The high-value solenoid control signal 211 pulls the drain terminal of the fast shut-off switch (Q1) to the ground reference. As a result, the energy stored in the capacitor (C1) is discharged. The gate terminal of the bypass current path switch (Q2) is separated from the high-voltage rail 201 by the free-wheeling diode (D1). Thus, the gate terminal realizes the voltage drop across the free-wheeling diode (D1). The discharged energy from the capacitor (C1) forces the gate terminal of the bypass current path switch (Q2) to approximately 0 volts such that the gate-to-source voltage of the bypass current path switch (Q2) is a negative voltage level which blocks current flow therethrough. Because the low-side switch 204 will be open (i.e., maintained in its off-state) during the disabled mode, the drive current discharged from the solenoid circuit 202 (e.g., the series RL circuit) is diverted to the Zener diode (D2) where it is quickly dissipated (see FIG. 4). Accordingly, the fast shut-off solenoid circuit network 200 enables rapid discharge of stored solenoid drive current in the Zener diode (D2) during scenarios where the solenoid circuit is required to be quickly shut-off.

As described above, various non-limiting embodiments provide a fast shut-off solenoid circuit network 200 that enables rapid discharge of stored solenoid drive current in the Zener diode (D2) when solenoid circuit shut-off is required, while also allowing the drive current briefly discharged from an enabled solenoid circuit during the low-side switch the off-state to bypass the Zener diode (D2) during normal operation. In this manner, the fast shut-off solenoid circuit network 200 can meet aggressive shut-down timing requirements, while improving energy consumption and reducing thermal discharge during normal operating conditions.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A fast shut-off solenoid circuit network comprising:
a solenoid circuit operable in response to an electrical current, and configured to operate in an enabled mode and a disabled mode;
a low-side switch;
a pulse width modulation (PWM) circuit configured to generate a pulsed output signal that continuously switches the low-side switch between an on-state and an off-state during the enable mode to adjust a level of the current flowing through the solenoid circuit, and maintains the low-side switch in the off-state during the disable mode;
a current dissipation circuit configured to dissipate the current discharged from the solenoid circuit in response to invoking the disable mode; and
a dissipation bypass circuit configured to divert all of the current discharged by the solenoid circuit entirely away from the current dissipation circuit when operating in the enable mode.

2. The fast shut-off solenoid circuit network of claim 1, wherein the dissipation bypass circuit diverts the current discharged from the solenoid circuit during the off-state of the low-side switch.

3. The fast shut-off solenoid circuit network of claim 2, wherein the dissipation bypass circuit includes a bypass current path switch that blocks the current from flowing through a first current path so as to divert all of the current discharged from the solenoid circuit entirely away from the current dissipation circuit when operating in the enable mode, and flows all of the current through a second current path that diverts all of the current directly to the current dissipation circuit in response to invoking the disable mode.

4. The fast shut-off solenoid circuit network of claim 3, further comprising a current path control circuit that commands the bypass current path switch to select the first current path in response to receiving a first control signal having a first voltage value, and commands the bypass current path switch to select the second current path in response to receiving a second control signal having a second voltage different from the first voltage.

5. The fast shut-off solenoid circuit network of claim 4, wherein the current path control circuit includes a metal oxide field effect transistor (MOSFET) comprising:
a source terminal in signal communication with the first current path; and
a gate terminal configured to selectively receive the first control signal having a first voltage and a second control signal having the second voltage greater than the first voltage,
wherein the MOSFET forces the bypass current path switch to select the first current path in response to receiving the first control signal, and forces the bypass current path switch to select the second current path in response to receiving the second control signal.

6. The fast shut-off solenoid circuit network of claim 5, further comprising an electrical hardware controller in signal communication with the gate terminal of the MOSFET and the PWM circuit, the controller configured to output the first and second control signals based on at least operating condition.

7. The fast shut-off solenoid circuit network of claim 6, wherein the controller outputs the first control signal when detecting normal operating conditions, and outputs the second control signal when detecting at least one fault condition.

8. The fast shut-off solenoid circuit network of claim 3, wherein the current dissipation circuit includes a Zener diode interposed between the solenoid circuit and the bypass current path switch, the Zener diode configured to dissipate the current discharged from the solenoid circuit in response to invoking the disable mode.

9. A method of dissipating energy stored in a solenoid circuit, the method comprising:
   delivering electrical current to a solenoid circuit that is configured to operate in an enable mode and a disable mode;
   continuously switching a low-side switch configured between an on-state and an off-state during the enable mode to adjust a level of the current flowing through the solenoid circuit;
   generating a pulsed output signal, via a pulse width modulation (PWM) circuit, that continuously switches the low-side switch between the on-state and the off-state during the enable mode; and
   disconnecting the pulsed output signal in response to invoking the disable mode such that the low-side switch is maintained in the off-state
   dissipating the current discharged from the solenoid circuit, via a current dissipation circuit, in response to invoking the disable mode; and
   diverting all of the current discharged from the solenoid circuit entirely away from the current dissipation circuit, via a dissipation bypass circuit, when operating in the enable mode.

10. The method of claim 9, wherein the dissipation bypass circuit diverts the current discharged from the solenoid circuit during the off-state of the low-side switch.

11. The method of claim 10, further comprising inhibiting, via a bypass current path switch included in the dissipation bypass circuit, the current from flowing through a first current path so as to divert the current discharged from the solenoid circuit entirely away from the current dissipation circuit when operating in the enable mode, and flowing all of the current, via the bypass current path switch, through a second current path so as to divert all of the current directly to the current dissipation circuit in response to invoking the disable mode.

12. The method of claim 11, further comprising commanding, via a current path control circuit, the bypass current path switch to select the first current path in response to receiving a first control signal having a first voltage value, and commanding the bypass current path switch to select the second current path in response to receiving a second control signal having a second voltage different from the first voltage.

13. The method of claim 12, further comprising:
   forcing the bypass current path switch to select the first current path and deliver the discharged current to a source terminal of a metal oxide field effect transistor (MOSFET) in response to delivering the first control signal to a gate terminal of the MOSFET; and
   forcing the bypass current path switch to select the second current path such that the discharged current is blocked from flowing through the MOSFET and is delivered directly to the current dissipation circuit in response to delivering the second control signal to the gate terminal.

14. The method of claim 13, outputting the first and second control signals, via an electronic hardware controller, based on at least operating condition determined by the controller.

15. The method of claim 14, further comprising outputting the first control signal when the controller detects normal operating conditions, and outputting the second control signal in response to the controller detecting at least one fault condition.

16. The method of claim 11, further comprising, in response to invoking the disable mode, dissipating the current discharged from the solenoid circuit using a Zener diode connected between the solenoid circuit and the bypass current path switch.

* * * * *